United States Patent
Matsuyama

(10) Patent No.: US 8,288,833 B2
(45) Date of Patent: Oct. 16, 2012

(54) SEMICONDUCTOR DEVICE AND MANUFACTURING METHOD THEREOF

(75) Inventor: Seiji Matsuyama, Ibaraki (JP)

(73) Assignee: Panasonic Corporation, Osaka (JP)

( * ) Notice: Subject to any disclaimer, the term of this patent is extended or adjusted under 35 U.S.C. 154(b) by 46 days.

(21) Appl. No.: 12/949,464

(22) Filed: Nov. 18, 2010

(65) Prior Publication Data
US 2011/0062530 A1 Mar. 17, 2011

Related U.S. Application Data

(63) Continuation of application No. PCT/JP2009/004505, filed on Sep. 10, 2009.

(30) Foreign Application Priority Data

Dec. 26, 2008 (JP) .................................. 2008-333088

(51) Int. Cl.
*H01L 29/78* (2006.01)
(52) U.S. Cl. .................. 257/412; 257/E21.625
(58) Field of Classification Search .................. 438/199, 438/200, 420; 257/213, 288, 410, 411, 412, 257/E21.625, 310
See application file for complete search history.

(56) References Cited

U.S. PATENT DOCUMENTS

| | | | |
|---|---|---|---|
| 2002/0137250 A1 | 9/2002 | Nguyen et al. | |
| 2002/0137317 A1 | 9/2002 | Kaushik et al. | |
| 2005/0224897 A1* | 10/2005 | Chen et al. | 257/410 |
| 2006/0011584 A1* | 1/2006 | Itano et al. | 216/83 |
| 2008/0096383 A1 | 4/2008 | Tigelaar et al. | |
| 2008/0203488 A1 | 8/2008 | Chung et al. | |
| 2009/0039447 A1* | 2/2009 | Copel et al. | 257/411 |
| 2009/0050982 A1 | 2/2009 | Pantisano et al. | |
| 2009/0146215 A1 | 6/2009 | Ogawa | |

FOREIGN PATENT DOCUMENTS

| | | |
|---|---|---|
| JP | 2004-533108 | 10/2004 |
| JP | 2005-534163 | 11/2005 |
| JP | 2007-324594 | 12/2007 |
| JP | 2008-166713 | 7/2008 |
| JP | 2008-219006 | 9/2008 |
| JP | 2008-243994 | 10/2008 |
| JP | 2009-141168 | 6/2009 |
| WO | WO-02/075813 A1 | 9/2002 |
| WO | WO-03/079413 A2 | 9/2003 |

OTHER PUBLICATIONS

H. N. Alshareef et al., "Work function engineering using lanthanum oxide interfacial layers," Appl. Phys. Lett. 89, (2006) pp. 232103-1-232103-3.
H. N. Alshareef et al., "Thermally Stable N-Metal Gate MOSFETs Using La-Incorporated HfSIO Dielectric," 2006 Symposium on VLSI Technology Digest of Technical Papers, 2008, pp. 7-8.
H.N. Alshareef et al., "Work function eingineering using lanthanum oxide interfacial layers," Applied Physics Letters 89, 232103 (2006).
H.N. Alshareef et al., "Thermally Stable N-Metal Gate MOSFETs Using La-Incorporated HfSiO Dielectric," 2006 Symposium on VLSI Technology Digest of Technical Papers, 2006 IEEE.

* cited by examiner

*Primary Examiner* — Brook Kebede
(74) *Attorney, Agent, or Firm* — McDermott Will & Emery LLP

(57) ABSTRACT

A semiconductor device includes: a semiconductor substrate; an interface layer formed on the semiconductor substrate; a high-k gate dielectric film formed on the interface layer; and a gate electrode formed on the high-k gate dielectric film. The high-k gate dielectric film contains La. The high-k gate dielectric film has the higher La concentration in an interface with the gate electrode than in an interface with the interface layer.

11 Claims, 5 Drawing Sheets

SEMICONDUCTOR DEVICE AND MANUFACTURING METHOD THEREOF

CROSS-REFERENCE TO RELATED APPLICATION

This is a continuation of PCT International Application PCT/JP2009/004505 filed on Sep. 10, 2009, which claims priority to Japanese Patent Application No. 2008-333088 filed on Dec. 26, 2008. The disclosures of these applications including the specifications, the drawings, and the claims are hereby incorporated by reference in its entirety.

BACKGROUND

A technique disclosed in the present invention relates to semiconductor devices including a high dielectric constant (high-k) gate dielectric film, and especially a gate dielectric film that is made of hafnium oxide or zirconia oxide, or silicon oxide containing hafnium oxide and zirconia oxide, and manufacturing methods of the same.

An increase in gate capacity per unit area, that is, a further reduction in thickness of a gate dielectric film, is required in order to reduce power consumption and increase performance of 32-nm generation complementary metal oxide semiconductor (CMOS) devices. However, using conventional silicon oxide film materials for the gate dielectric film increases a leakage current, which results from a reduction in thickness, to an unacceptable level. Thus, techniques of using for the gate dielectric film a high-k dielectric film having a higher relative dielectric constant than that of the conventional silicon oxide film materials have been developed. A HfSiON film that is thermally stable at 1,000° C. or higher and has a relative dielectric constant of 13 or more is one of the most promising candidates for the material of the high-k dielectric film. However, in conventional structures using the HfSiON film as a gate dielectric film and using polysilicon gate electrodes, an increase in threshold voltage due to Fermi level pinning cannot be ignored in addition to an increase in equivalent oxide thickness (EOT) due to depletion, especially in P-type metal-insulator-semiconductor (MIS) transistors.

Gate stack techniques using metal gate electrodes, instead of the polysilicon gate electrodes, have been remarkably developed in order to address these problems. In the case of using metal gates for bulk CMOS devices, a metal having an effective work function (eWF) close to the conduction band of silicon (Si) must be selected for n-type MIS transistors, and a metal having an eWF close to the valence band of Si must be selected for p-type MIS transistors. Specifically, a metal having an effective work function of 4.8 eV or more needs to be selected for the p-type MOS transistors, and a metal having an effective work function of 4.3 eV or less needs to be selected for the n-type MIS transistors.

General relations between metal materials and their work functions show that metal materials such as titanium (Ti), molybdenum (Mo), or tantalum (Ta) are candidate for the n-type MIS transistors, and metal materials such as platinum (Pt), ruthenium oxide ($RuO_2$), or titanium nitride (TiN) are candidate for the p-type MIS transistors. Thus, it is desirable to configure a dual metal gate process by selecting the above materials as the metal gates of the p-type MIS transistors and the metal gates of the n-type MIS transistors.

However, the candidate n-type materials described above (Ti, Mo, Ta) have many integration problems, such as difficulty of etching and cleaning, and unstable characteristics with elevated thermal budget (up to 700 C).

On the other hand, another method has been proposed to obtain a desired work function as n-type MIS transistors without using the above metal materials as a metal gate material of the n-type MIS transistors. That is, a method has been proposed to include a metal capable of changing a work function to that of the n-type MIS transistor, such as lanthanum (La), Dysprosium, (Dy), Erbium (Er), or Gadolinium (Gd), in, e.g., a gate dielectric film, or to insert this metal between the metal gate and the gate dielectric film. For example, in the structure in which this metal is inserted between the metal gate and the gate dielectric film, a desired work function can be obtained using candidate metal materials of the n-type MIS transistors. As a result, a desired transistor threshold voltage as the n-type MIS transistors can be obtained (e.g., see Japanese Published Patent Application No. 2007-324594).

SUMMARY

Incidentally, the above method of incorporating the metal such as La into the gate dielectric film, such as HfSiON, enables a desired work function to be obtained, but causes degradation of on-state current drivability, carrier mobility, and reliability of the transistors. Thus, there is a trade-off between the variation of the work function and the performance of the transistor.

In a viewpoint of the problems describing above, it is a purpose that the present invention implements a semiconductor device having desired work functions, and prevent a performance degradation of semiconductor devices.

In order to achieve improvements described above, a semiconductor device according to the embodiment of the present invention includes:
a semiconductor substrate; an interface layer formed on the semiconductor substrate;
a high-k gate dielectric film formed on the interface layer;
in addition, a gate electrode formed on the high-k gate dielectric film, wherein the high-k gate dielectric film contains lanthanum, and the high-k gate dielectric film has a higher lanthanum concentration in an interface with the gate electrode than in an interface with the interface layer.

In the semiconductor device according to the embodiment of the present invention, the La concentration (atomic %) in the interface of the high-k gate dielectric film with the interface layer is preferably 3% or less, and more preferably 2% or less, of the entire HfLaSiON composition. Note that it is preferable that the bulk concentration ratio of La to all the elements of the high-k gate dielectric film be 5% or less.

In the semiconductor device according to the embodiment of the present invention, it is preferable that the high-k gate dielectric film have the La concentration (atomic %) of 7% or less in the interface with the gate electrode.

In the semiconductor device according to the embodiment of the present invention, it is preferable that the interface layer have the La concentration (atomic %) of 2% or less in an interface with the semiconductor substrate. It is more preferable that the interface layer have the La concentration (atomic %) of 1% or less in the interface with the semiconductor substrate.

In the semiconductor device according to the embodiment of the present invention, it is desirable that the La concentration distribution have such a profile that the La concentration decreases monotonically from the gate electrode side toward the semiconductor substrate.

In the semiconductor device according to the embodiment of the present invention, it is preferable that the La concentration distribution have such a profile that the La concentration decreases sharply from the gate electrode side toward a central portion in a height direction of the high-k dielectric film, and then decreases gradually toward the interface layer.

In the semiconductor device according to the example aspect of the present invention, it is preferable that the high-k dielectric film consist of hafnium silicon oxide (HfSiOx), hafnium oxide, Zirconium oxide (ZrO) or their composites.

In the semiconductor device according to the embodiment of the present invention, it is preferable that the gate electrode consist of titanium nitride (TiN), tantalum nitride (TaN), carbon-containing tantalum (TaC), or aluminum-containing titanium nitride (TiAlN).

A method for manufacturing a semiconductor device according to another embodiment of the present invention includes the steps of: (a) Forming an interface layer on a semiconductor substrate having a P-type transistor formation region and an N-type transistor formation region; (b) Forming a high-k gate dielectric film on the interface layer; (c) Forming a hard mask on the high-k film that covers the P-type transistor formation region; (d) After the step (c), forming the La layer over the semiconductor substrate; (e) Performing an annealing process to diffuse La from the La layer into the high-k gate dielectric film in the N-type transistor formation region; (f) Removing the La layer remaining after the step (e); and (g) Forming a P-type gate electrode on the high-k gate dielectric film in the P-type transistor region via the hard mask, and forming an N-type gate electrode on the high-k gate dielectric film in the N-type transistor region, wherein the high-k gate dielectric film has a higher La concentration in an interface with the gate electrode than in an interface with the interface layer.

In the method according to the another example aspect of the present invention, it is preferable that the La layer in the step (d) be formed by a PVD method using a target consist of La or $La_2O_3$, a CVD method or an atomic layer deposition method using the La containing organic source and an oxidant such as $H_2O$, $O_2$, or $O_3$. In addition, the annealing process in the step (e) should be performed at a temperature between 400° C. and 800° C., both inclusive.

According to the embodiment of the present invention, a semiconductor device is implemented which does not degrade interface characteristics, an on-state current drivability and carrier mobility of transistors, while providing a desired work function, a desired transistor threshold voltage and the improved reliability of transistor devices.

DETAILED DESCRIPTION

A semiconductor device and a manufacturing method thereof according to an example embodiment of the present invention will be described below with reference to the accompanying drawings.

FIGS. 1A-1E and 2A-2D are cross-sectional views sequentially illustrating the steps of a method for manufacturing a semiconductor device according to the present embodiment. Note that the region illustrated on the left side of each figure represents a p-type MIS transistor formation region 1A, and the region illustrated on the right side of each figure represents an n-type MIS transistor formation region 1B.

Figure 1:
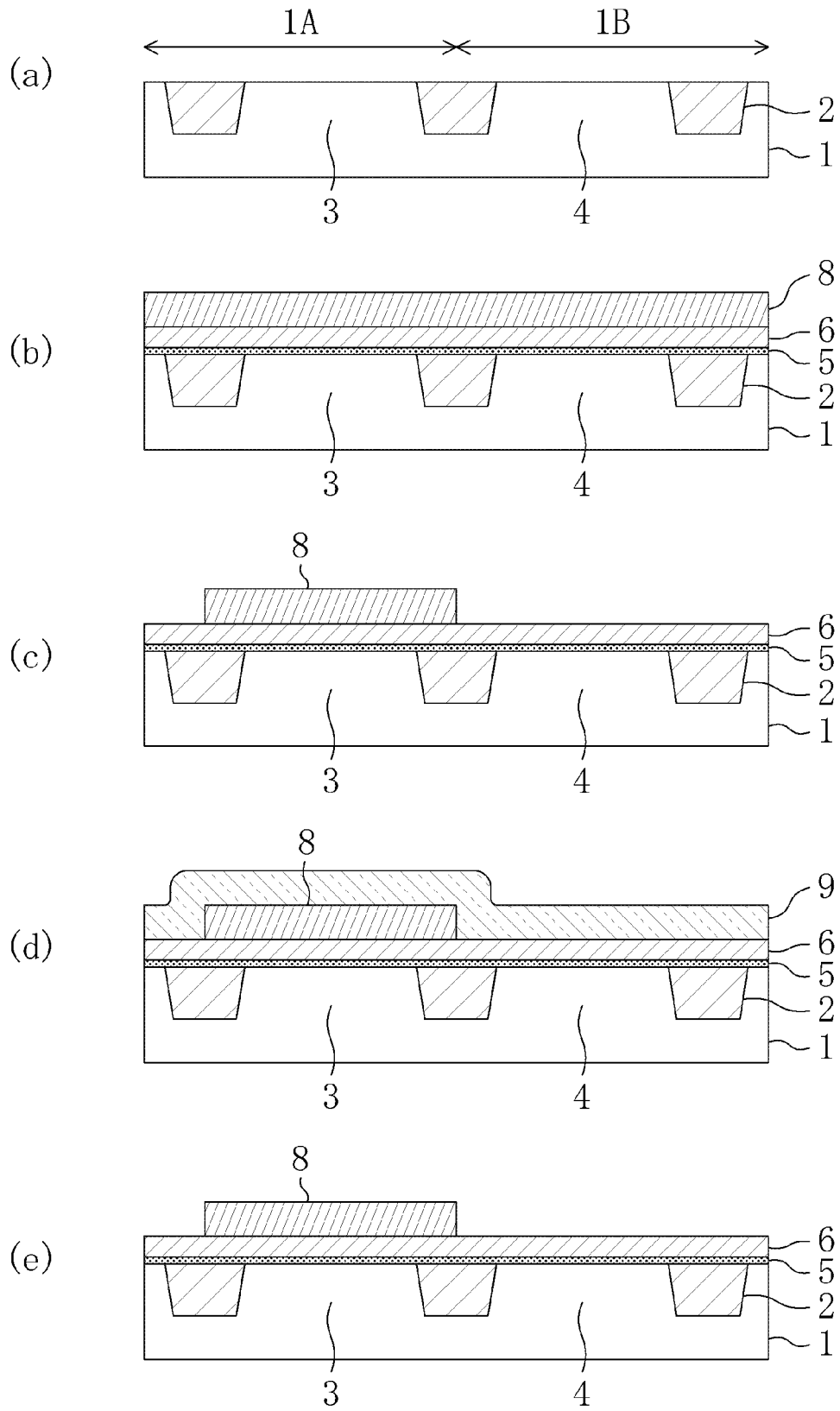
FIGS. 1A-1E are cross-sectional views sequentially illustrating the steps of a method for manufacturing a semiconductor device according to the embodiment of the present invention.

Firstly, as shown in FIG. 1A, an isolation dielectric film 2 is formed in an upper part of a semiconductor substrate 1 made of, e.g., silicon by using a local oxidation of silicon (LOCOS) method, a shallow trench isolation (STI) method. Secondly, a mask covers the n-type MIS region 1B, and n-type impurities are ion implanted into the semiconductor substrate 1 to form an n-well region 3 in the p-type MIS transistor formation region 1A in the semiconductor substrate 1. As a mask covers the p-type MIS formation region 1A, p-type impurities are ion implanted into the semiconductor substrate 1 to form a p-well region 4 in the n-type MIS transistor formation region 1B in the semiconductor substrate 1.

Then, as shown in FIG. 1B, a thermal oxide film 5 having a thickness between about 0.5 nm to about 1.5 nm, both inclusive, which is a very thin interface layer, is formed over the entire surface of the semiconductor substrate 1. Subsequently, a plasma nitriding process is performed at a pressure between 5 mTorr and 1,000 mTorr, both inclusive (1 mTorr is equal to 1/1000 Torr, and 1 Torr is equal to about $1.33 \times 10^2$ Pa. The same applies to the description below.), a mixed gas ratio Ar/$N_2$ of 1000/40, direct current power (DC power) between 0.5 kW and 3 kW, both inclusive, and a stage temperature ranging from room temperature to about 400° C., both inclusive. This can prevent an increase in thickness of the thermal oxide film 5 as the interface layer when annealing a high-k dielectric film 6 that is formed later.

Thereafter, an annealing process after the nitriding process is performed at a pressure between 0.5 Torr and 5 Torr, both inclusive, and a temperature of 1,000° C. in an oxygen atmosphere for about 15 seconds. This can facilitate an elimination of atomic nitrogen that is present in the interface layer 5, and can repair incomplete bonds or defects.

Subsequently, a high-k film 6, which is consists of a hafnium silicate (HfSiO), is formed on the thermal oxide film 5 by using tetrakis(ethylmethylamino)hafnium (TEMAH) and silane (SiH$_4$) as a source gas, and at a temperature between 500° C. and 600° C., both inclusive, and a mixed gas flow rate of TEMAH/SiH$_4$/O$_2$=50/50/1000 sccm. In order to achieve an EOT between about 1.0 nm and about 1.5 nm, both inclusive, it is preferable that the high-k dielectric film 6 be formed with a physical thickness between about 2 nm and about 3 nm, both inclusive. Note that an oxide film containing hafnium or zirconium, or a silicon oxide film can be used as the high-k dielectric film 6.

Then, the high-k film 6 is subjected to a plasma nitridation process in order to prevent crystallization of the high-k film 6. Note that the plasma nitridation process is performed under conditions similar to those of on the interface layer 5. Thereafter, the high-k dielectric film 6 is annealed in an oxygen or nitrogen atmosphere. This can remove impurities contained in the high-k dielectric film 6, can repair defects in the high-k dielectric film 6, and can increase adhesion of the high-k dielectric film 6 to the interface layer 5.

Thereafter, a titanium nitride (TiN) layer 8 as a hard mask is formed on the high-k dielectric film 6. In this example, the TiN layer 8 as a hard mask is formed on the high-k dielectric film 6 rather than forming directly on the high-k dielectric film 6 the La material as a material that changes the work function. This can prevent the Pch eWF from being changed by La diffusion into the high-k dielectric film 6 in the p-type MIS formation region 1A, as the La easily diffuses into the high-k film 6.

The TiN layer 8 may be formed by any of a Sputtering (PVD) method, a chemical vapor deposition (CVD) method, or an atomic layer deposition (ALD) method. For example, in the case of using the sputtering method, the TiN layer 8 is formed by a reactive sputtering method by using titanium (Ti) as a target, under a pressure of 1 Torr or less, DC power of 1 kW or less, and a DC voltage of about 100 V, and in an $Ar/N_2$ or $N_2$ plasma atmosphere. Regarding the thickness of the TiN layer 8, a range between about 4 nm and about 20 nm is desirable. If the thickness of TiN is thinner than 4 nm, La invasion into the high-k over the TiN hardmask is concerned, and if the thickness of TiN is thicker than 20 nm, the degradation of gate etching uniformity and Titanium residues after gate-etch are concerned.

Note that in the case of using the CVD method, the TiN film 8 can be formed by using a method of forming and nitriding the Ti film by using a source gas that is formed by titanium chloride ($TiCl_4$) and a nitriding species (e.g., $NH_3$, etc.). In the case of using the ALD method, the TiN film 8 is formed by alternately supplying a source gas such as titanium chloride ($TiCl_4$), and a nitriding species (e.g., $NH_3$, etc.). The use of the ALD method has many advantages not only in that film thickness control and impurity control can be improved, but also in that the process temperature can be reduced as compared to the CVD method.

Then, a part of the TiN film 8, which is located in the n-type MIS transistor formation region 1B, is etched away by lithography and etching techniques. In this case, conditions for the lithography and etching processes must be determined so that the high-k film 6 under the TiN film 8 is not damaged by exposure to a chemical that is used to remove the TiN film 8. Specifically, it is preferable to use a hydrochloric acid-hydrogen peroxide mixture (HPM), having a concentration of about 1/100 to 1/1000, which is a mixture of about 1/1000 to 1/100 of dilute hydrochloric acid (dHCl) or a hydrogen peroxide solution ($H_2O_2$) and hydrochloric acid (HCl), or a sulfuric acid-hydrogen peroxide mixture (SPM), having a concentration of about 1/100 to 1/1000, which is a mixture of a sulfuric acid ($H_2O_2$) and a hydrogen peroxide solution ($H_2O_2$).

Thereafter, as shown in FIG. 1D, the La layer 9 as a material that changes the work function is formed over the entire surface of the semiconductor substrate 1 by using a sputtering method or an ALD method. In the case of using the sputtering method, the La layer 9 can be formed by using the La target, and a DC discharge using an argon (Ar) gas. The La layer 9 made of the La oxide layer can be formed by a reactive sputtering method using an oxygen gas. Moreover, the La layer 9 made of the La oxide layer can be formed by a radio frequency (RF) sputtering method using the La oxide ($La_2O_3$) target, or also formed by an DC sputtering method using the La target. The La layer 9 can also be formed by the technique of a CVD or an ALD, such as vaporizing and depositing an organic material containing La, and then sequentially performing a purging process, an oxidation process, and a process of removing organic substances.

Conditions for forming the La layer 9 made of La oxide by using the RF sputtering method will be described in detail below as a example. Specifically, the film formation rate can be controlled to a range between about 40 sec per nanometer and about 100 sec per nanometer, both inclusive, by using RF power between 300 W and 1,000 W, both inclusive, a discharge pressure of about 0.1 Torr, and a DC discharge voltage of about 100 V. Thus, the La layer 9 having a thickness between about 0.1 nm and about 1 nm, both inclusive, and preferably between about 0.1 nm and about 2 nm, both inclusive, is formed on the high-k dielectric film 6 in the n-type MIS transistor formation region 1B.

Then, as shown in FIG. 1E, the La layer 9 is annealed so that the La element in the La layer 9 thermally diffuses into the high-k dielectric film 6 and is included therein. Specifically, the annealing process is performed at a temperature between about 600° C. and about 900° C., both inclusive, preferably between about 600° C. and about 800° C., both inclusive, and more preferably between about 600° C. and about 700° C., both inclusive, in a nitrogen atmosphere. The annealing time is in the range from several milliseconds to several minutes, both inclusive, and preferably from about one second to about 20 minutes, both inclusive.

Thereafter, an unreacted La compound on the high-k dielectric film 6 and the TiN layer 8 is removed after the annealing process. If the process proceeds to the subsequent step such as the step of forming gate electrodes, with the unreacted La compound remaining thereon, the excess La deteriorate the reliability of the N-type MIS transistor, or also cause deteriorating TiN etching rates in elimination of TiN hard mask at P-type MIS transistor side, their residues cause degradation not only of transistor properties, but also of yield rates in manufacturing.

In the case of removing the unreacted La by a cleaning process, conditions for the cleaning process need to be determined so that the high-k dielectric film 6 in the n-type MIS transistor formation region 1B is not damaged by exposure to a chemical. Specifically, it is preferable to use a hydrochloric acid-hydrogen peroxide mixture (HPM) having a concentration of about 1/100 to 1/1000, which is a mixture of about 1/1000 to 1/100 of dilute hydrochloric acid (dHCl) or a hydrogen peroxide solution ($H_2O_2$) and hydrochloric acid (HCl), or a sulfuric acid-hydrogen peroxide mixture (SPM) having a concentration of about 1/100 to 1/1000, which is a mixture of sulfuric acid ($H_2SO_4$) and a hydrogen peroxide solution ($H_2O_2$).

The La diffusion length in the TiN layer 8 after the annealing process depends on the annealing temperature, and is about 3 nm when the annealing process is performed at 800° C. Thus, it is desirable that the TiN layer 8 should be overetched by at least about 3-5 nm from its surface for eliminating the unreached La. It is also desirable to remove the unreacted La and the surface layer of the TiN layer 8 in the P-type MIS transistor formation region 1A while minimizing damage to the high-k dielectric film 6 in the N-type MIS transistor formation region 1B. It is also possible to remove the TiN layer 8 completely if the resultant damage to the high-k dielectric film 6 is within an acceptable range.

Figure 2:
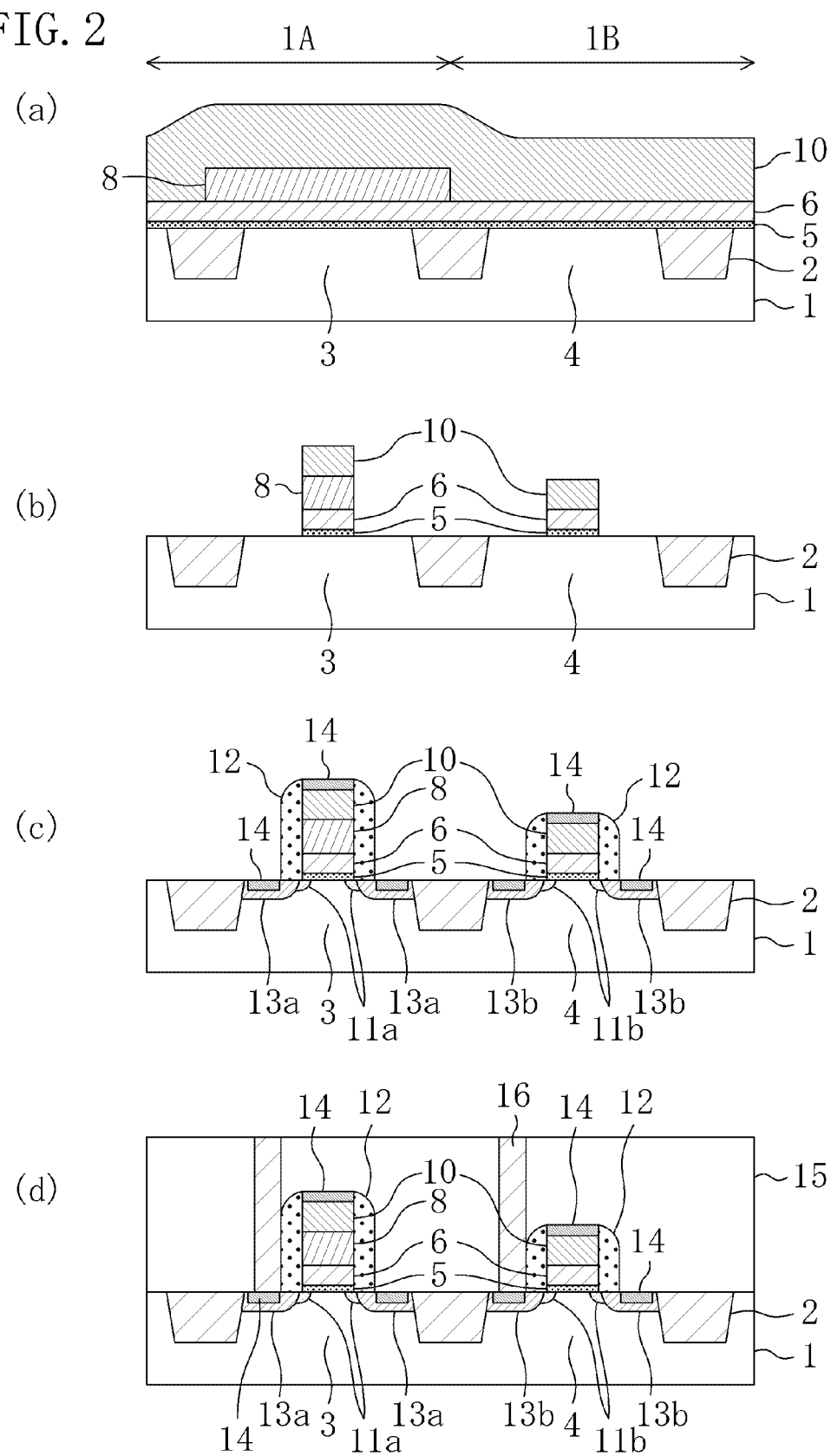
FIGS. 2A-2D are cross-sectional views sequentially illustrating the steps of the method for manufacturing a semiconductor device according to the example embodiment of the present invention.

Then, as shown in FIG. 2A, a TiN layer 10 as a gate electrode material in the N-type MIS transistor formation region 1B is formed over the entire surface of the semiconductor substrate 1. Like the formation of the TiN layer 8 as a hard mask described above, the TiN layer 10 can be formed by using a PVD method, a CVD method, or an ALD method. The thickness of the TiN layer 10 is preferably in the range between 4 nm and 20 nm, both inclusive.

In addition to titanium nitride (TiN) mentioned above, tantalum nitride (TaN), carbon-containing tantalum (TaC), or aluminum-containing titanium nitride (TiAlN) can be used as the gate electrode material.

Subsequently, a polysilicon film doped with phosphorus at a concentration between about $1\times10^{14}/cm^2$ and about $2\times10^{15}/cm^2$, both inclusive is deposited with a thickness between 30 nm and 150 nm, both inclusive (not shown).

Thereafter, as shown in FIG. 2B, in the P-type MIS transistor formation region 1A, the doped polysilicon film, the TiN layer 10, the TiN layer 8, the high-k dielectric film 6, and the interface film 5 are patterned by lithography and etching techniques to form a P-type gate electrode. In the N-type MIS transistor formation region 1B, the doped polysilicon film, the TiN layer 10, the high-k dielectric film 6, and the interface layer 5 are patterned to form an N-type gate electrode.

Then, as shown in FIG. 2C, P-type impurity diffusion layers 11a having a relatively shallow junction depth, sidewalls 12, P-type impurity diffusion layers 13a having a relatively deep junction depth, and silicide layers 14 are formed in the P-type MIS transistor formation region 1A by known methods. Similarly, N-type impurity diffusion layers 11b having a relatively shallow junction depth, sidewalls 12, N-type impurity diffusion layers 13b having a relatively deep junction depth, and silicide layers 14 are formed in the N-type MIS transistor formation region 1B.

As shown in FIG. 2D, by using a known method, an interlayer dielectric film 15, which is made of, e.g., a silicon oxide film, is formed over the semiconductor substrate 1 so as to cover the P-type gate electrode and the N-type gate electrode. Then, contact plugs 16, which are made of, e.g., tungsten, are formed so as to extend through the interlayer dielectric film 15 to the silicide layers 14. Thereafter, wirings and the like, not shown, are formed.

The structure of the semiconductor device according to the example embodiment of the present invention can be manufactured by the steps described above with reference to FIGS. 1A-1E and 2A-2D.

Characteristics of the semiconductor device according to the example embodiment of the present invention will be described in detail below.

Figure 3:
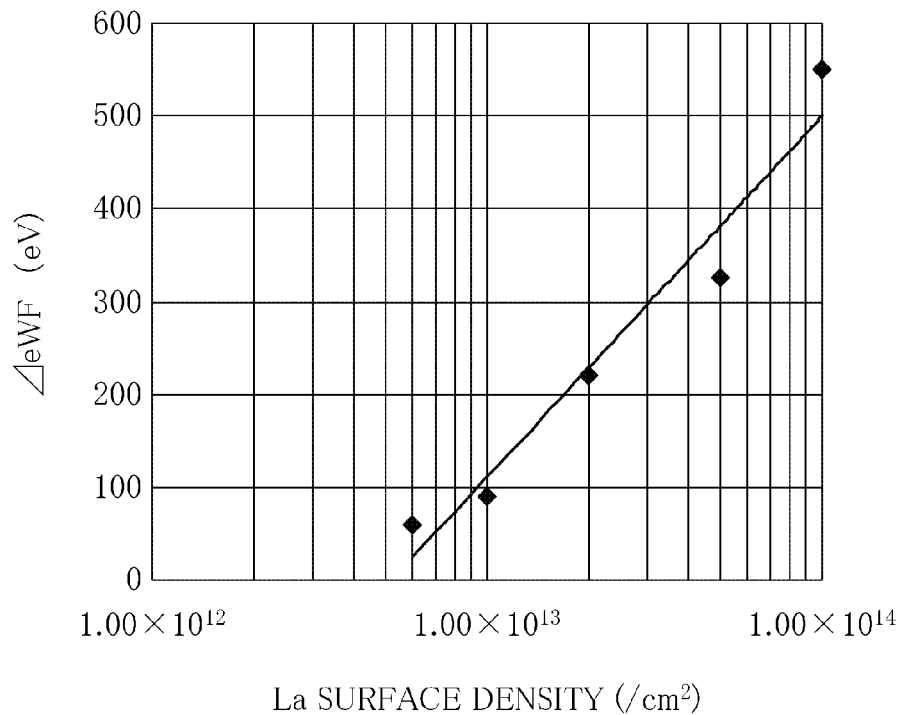
FIG. 3 is a graph showing the relation between the La concentration (/cm$^2$) in a high-k dielectric film and the shift amount of the effective work function, ΔeWF (eV), in an N-type MIS transistor that is formed in an N-type MIS transistor formation region.

FIG. 3 shows the relation between the La concentration (surface density) ($/cm^2$) in the high-k dielectric film 6 and the variation of the effective work function, $\Delta eWF$ (eV), in the N-type MIS transistor that is formed in the N-type MIS transistor formation region 1B.

As shown in FIG. 3, the variation of the effective work function, $\Delta eWF$, increases in proportion to the La concentration in the high-k dielectric film 6 in the N-type MIS transistor.

Figure 4:
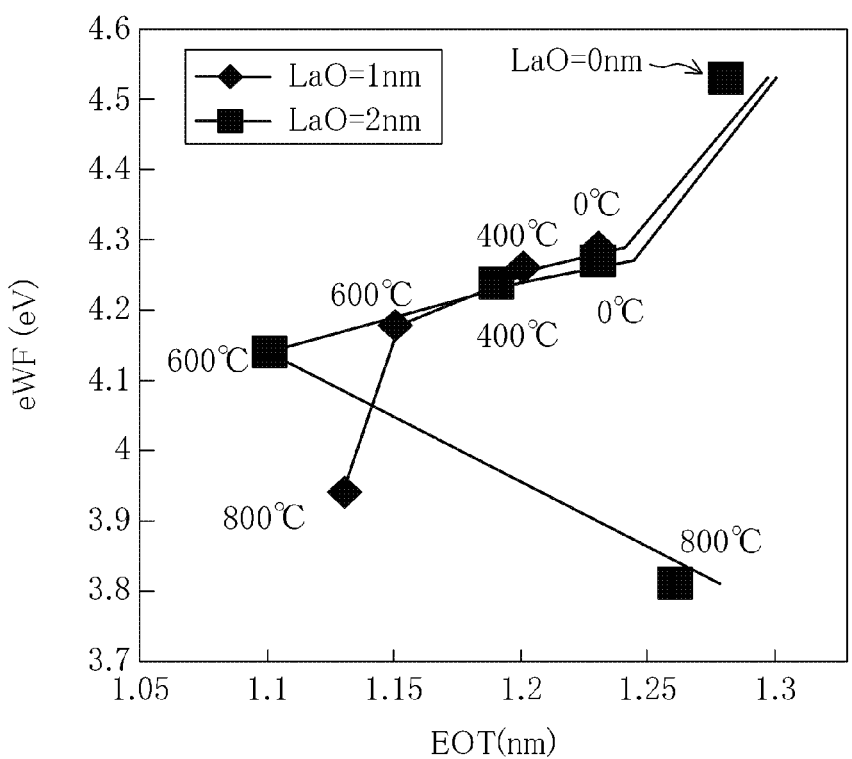
FIG. 4 is a graph showing the relation between the equivalent oxide thickness (EOT) of the high-k dielectric film and the effective work function eWF (eV), in the N-type MIS transistor that is formed in the N-type MIS transistor formation region.

FIG. 4 shows the relation between the equivalent oxide thickness (EOT) and the effective work function eWF (eV) in N-type MIS transistor changing $La_2O_3$ deposition amounts and annealing temperature.

As shown in FIG. 4, the EOT and the eWF variation are also dependent on the La amount, which is introduced into the high-k dielectric film 6. This shows that the relative dielectric constant is further increased as La is included in the high-k dielectric film 6, e.g., a HfSiOn film. FIG. 4 also shows that in the case of using, e.g., the $La_2O_3$ layer having a thickness of 1 nm as the La layer 9, the EOT and the effective work function starts to decrease significantly until the annealing temperature is increased to 600° C. Similarly, in the case of using, e.g., the $La_2O_3$ layer having a thickness of 2 nm as the La layer 9, the effective work function starts to decrease significantly, but the EOT increase significantly when annealing temperature is increased to more than 600° C.

Figure 5:
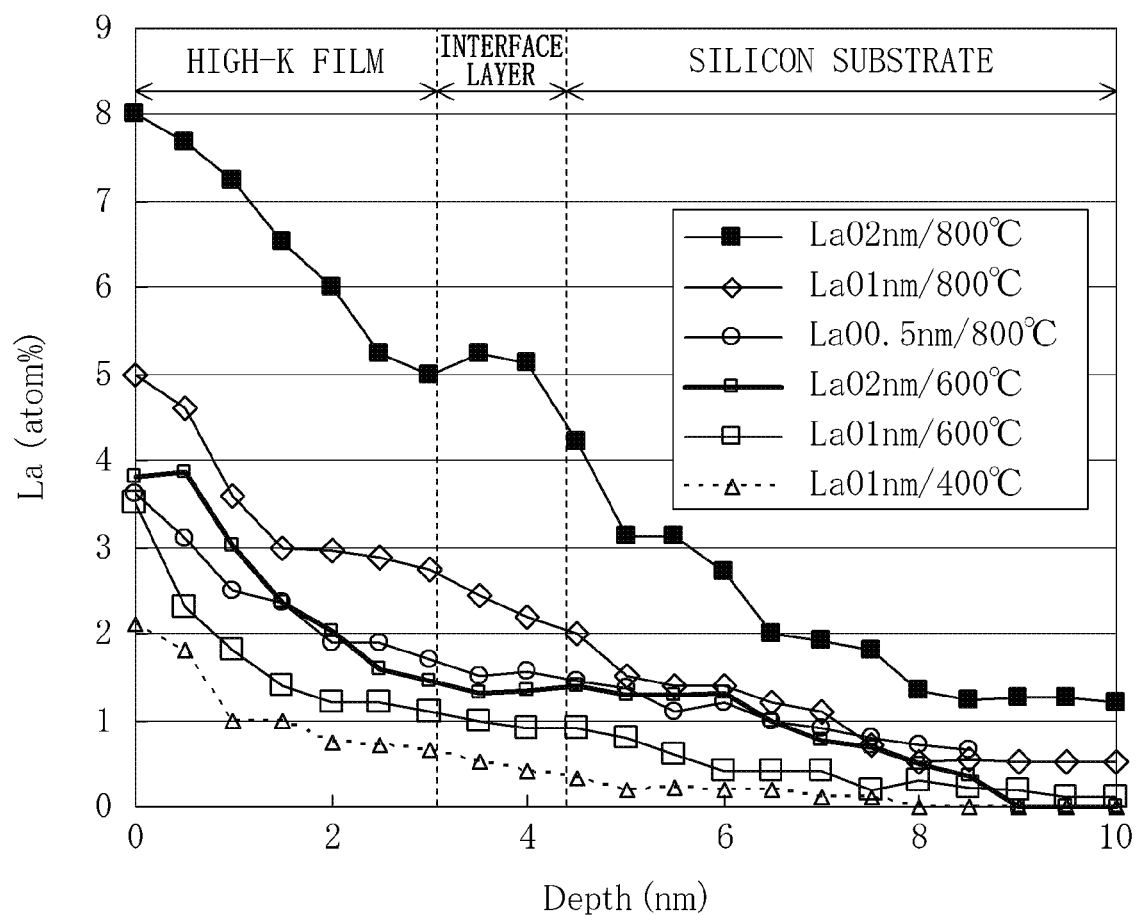
FIG. 5 is a distribution chart of La in a depth direction in the high-k dielectric film, an interface layer, and a silicon semiconductor substrate in the N-type MIS transistor that is formed in the N-type MIS transistor formation region.

FIG. 5 shows distributions of the La concentration (atomic %) in the depth direction in the high-k dielectric film 6, the interface layer 5, and the silicon semiconductor substrate (the silicon substrate) in the N-type MIS transistor that is formed in the N-type MIS transistor formation region.

As shown in FIG. 5, in the case where La oxide (LaO) as the La layer 9 has a thickness of 0.5 nm, 1 nm, or 2 nm, and high temperature annealing is performed at 600° C. or 800° C. (spike annealing is not performed). The La in the La layer 9 diffuses deeply into the high-k dielectric film 6, and further diffuses beyond the interface with the interface layer 5, and beyond the interface between the interface layer 5 and the silicon substrate (the semiconductor substrate 1). However, in the case where the $La_2O_3$ has a thickness of 1 nm or 2 nm, and the high temperature annealing is performed at 800° C., La diffuses at a higher concentration and to a greater depth as compared to the other cases (the La oxide has a thickness of 2 nm, and the annealing temperature is 600° C.; the $La_2O_3$ has a thickness of 0.5 nm, and the annealing temperature is 800° C.; and the $La_2O_3$ has a thickness of 1 nm, and the annealing temperature is 600° C.). This result corresponds to the result of FIG. 4 that the effective work function varies, and the EOT decreases at a reduced rate or increases, in the case where the $La_2O_3$ has a thickness of 1 nm or 2 nm, and the annealing temperature is 800° C. A possible reason for this is that when the annealing temperature is 800° C. or higher, and the $La_2O_3$ as the La layer 9 has a thickness of 1 nm or more, La, which diffuses deeply and at a high concentration, reacts with the silicon substrate or the interface layer 5, and the EOT tends to increase.

Table 1 below shows the following values, regarding the N-type MIS transistor that is formed in the N-type MIS region 1B under the deposition conditions of La and the annealing condition: the La concentration (atomic %) in the interface between the interface layer (the thermal oxide film) 5 and the high-k dielectric film 6, the variation of the effective work function, $\Delta eWF$ (eV), and the mobility degradation ratio $\Delta\mu/\mu$ (%) as compared with the case which the N-type MIS transistor is formed without La.

TABLE 1

| LaO Film Thickness | Annealing Temperature | High-k Interface La Concentration (%) | eWF Shift Amount $\Delta eWF$ (eV) | Degree of Mobility Degradation $\Delta\mu/\mu$ (%) |
|---|---|---|---|---|
| None | N/A | 0 | 0 | 0.0 |
| 1 nm | 600° C. | 1.20 | 0.31 | −4.20 |
| 1 nm | 800° C. | 2.89 | 0.43 | −9.70 |
| 2 nm | 800° C. | 5.23 | 0.54 | −19.8 |

Figure 6:
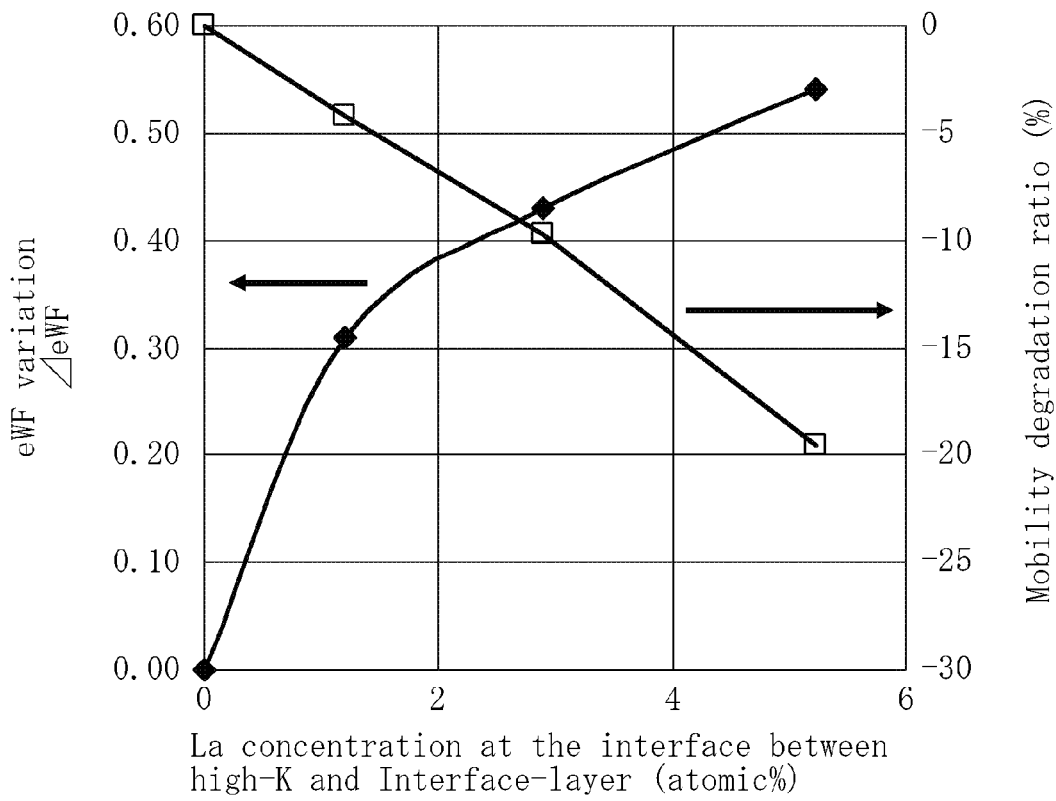
FIG. 6 shows the variation of the effective work function, ΔeWF (eV), and carrier mobility degradation ratio in relation to the La concentration

FIG. 6 is a plot based on the result of Table 1, where the abscissa represents the interface La concentration (atomic %), and the ordinate represents the shift amount $\Delta eWF$ (eV) and the degree of mobility degradation $\Delta\mu/\mu$ (%).

As shown in FIG. 6, as the annealing temperature is increased, the La concentration in the interface between the interface layer (the thermal oxide film) 5 and the high-k dielectric film 6 increases, and the shift amount of the effective work function increases, but the carrier mobility degrades. That is, FIG. 6 shows that in the case where the LaO layer has a thickness of 1 nm, and the annealing temperature is 800° C., the La concentration in the interface between the interface layer 5 and the high-k dielectric film 6 is about 3% as a composition ratio, and the effective work function is increased, but the carrier mobility degrades significantly.

FIG. 6 also shows that the mobility is further degraded in the case where the LaO layer has a thickness of 2 nm. Thus, it is important to control the annealing temperature and the diffusion concentration of La from the high-k dielectric film 6 into the interface layer 5.

As can be seen from the results of FIGS. 3-6, in order to improve EOT and reduce the carrier mobility degradation with optimal the effective work function (eWF), it is desirable that the La concentration (atomic %) in the interface of the high-k dielectric film 6 with the interface layer 5 be 3% or less, as shown in FIGS. 4-5. In the case where the annealing temperature is 800° C. and the LaO layer as the La layer 9 has a thickness of 1 nm, the EOT has already started to decrease at a reduced rate, and the effective work function has already started to decrease, as shown in FIG. 4. Thus, it is more desirable that the La concentration (atomic %) be 2% or less. Note that it is preferable that the bulk concentration ratio of La to all the elements of the high-k dielectric film 6 be 5% (the surface density of about $2 \times 10^{13}/cm^2$) or less.

(Modification)

A modification of the semiconductor device and the manufacturing method thereof according to the embodiment of the present invention will be described below.

The above manufacturing method of the semiconductor device is described with respect to the step of forming the La layer 9 over the high-k dielectric film 6 and diffusing La contained in the La layer 9 into the high-k dielectric film 6 by an annealing process. In this modification, the La layer 9 is formed in multiple stages, and the annealing process is performed in multiple stages. The other steps are similar to those described above.

Specifically, for example, as a first stage, a thin La layer (thickness: 0.3 nm) is deposited, and an annealing process is performed at a high temperature (annealing temperature: 800° C. or higher). As a second stage, a thick La layer (thickness: 1.0 nm) is deposited, and an annealing process is performed at an intermediate temperature (annealing temperature: 700° C. or higher). As a third stage, a thick La layer (thickness: 1.0 nm) is deposited, and an annealing process is performed at a low temperature (annealing temperature: 600° C. or higher). Note that the annealing processes are preferably performed in a nitrogen gas atmosphere. The La distribution in the high-k dielectric film 6 is finely controlled by controlling the deposition thickness of the La layer 9 and the annealing temperature in multiple stages as described above.

Such multistage control is used for the following reasons. If La solid-phase diffuses into the high-k dielectric film 6, and high temperature annealing is used, the reaction between La and the high-k dielectric film 6 proceeds substantially at a diffusion controlled rate. On the other hand, the reaction between La and the high-k dielectric film 6 proceeds at controlled rate at which the La diffuses slowly in the high-k dielectric film 6 using low temperature annealing.

Figure 7:
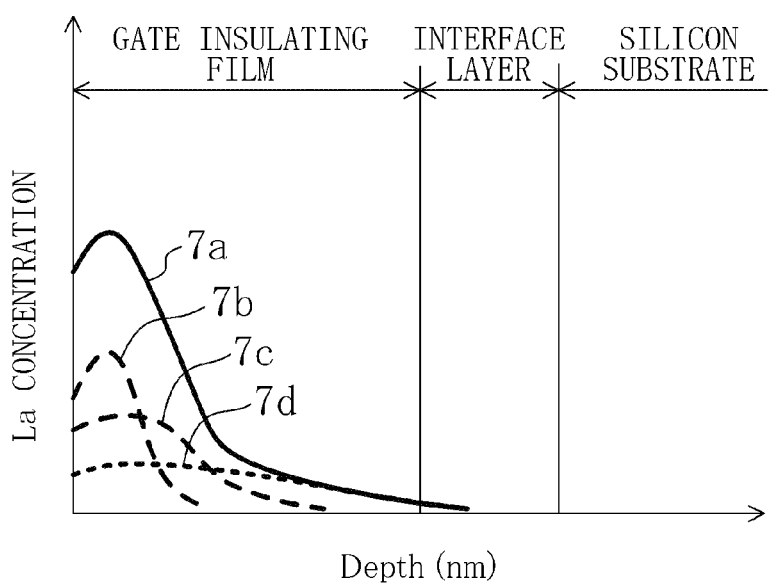
FIG. 7 is a distribution profile of the La concentration in a depth direction obtained by using multistage control according to a modification, in the N-type MIS transistor that is formed in the N-type MIS transistor formation region.

FIG. 7 shows La concentration distributions in the depth direction in the N-type MIS transistor that is formed in the N-type MIS transistor formation region 1B. Specifically, FIG. 7 shows La concentration distributions 7b-7d in the first to third stages (the first stage 7d using the high temperature annealing, the second stage 7c using the intermediate temperature annealing, and the third stage 7d using the low temperature annealing), and an accumulated La concentration distribution 7a of the first to third stages.

As shown in FIG. 7, in the case where La is diffused into the high-k dielectric film 6 by the multistage control of the first to third stages, the resultant La distribution is such that the La concentration is; 7% in the interface between the high-k dielectric film 6 and the gate electrode, 2.5% in the interface between the high-k dielectric film 6 and the interface layer 5, and 1% in the interface between the interface layer 5 with the silicon substrate.

In this manner, La can be distributed at a high concentration on the surface side of the high-k dielectric film 6 (on the side of the interface with the n-type gate electrode) while controlling diffusion of La into the interface between the high-k dielectric film 6 and the interface layer 5. That is, it is desirable that the La concentration be 7% in the interface between the high-k dielectric film 6 and the n-type gate electrode, 3% (more preferably 2%) in the interface between the high-k dielectric film 6 and the interface layer 5, 2% (more preferably 1%) in the interface between the interface layer 5 and the silicon substrate. In this case, the EOT can further be improved, and the effective work function (eWF) also be improved in this modification. Moreover, the transistor threshold voltage Vt can also be improved according to the eWF improvement. At the same time, such device characteristics can be obtained that do not cause a deterioration in reliability such as carrier mobility degradation. Note that the present modification is described with respect to an example in which the multistage control is the three-stage control. However, it should be understood that the number of stages is not limited to three.

Note that the above example embodiment is a preferred specific example for carrying out the present invention, and thus various technical limitations are placed thereon. However, the present invention is not limited to the example embodiment set forth herein, unless otherwise specified, and various changes and modifications may be made without departing from the scope of the technical idea of the present invention.

What is claimed is:

1. A semiconductor device, comprising:
   a semiconductor substrate;
   an interface layer formed on the semiconductor substrate;
   a high-k gate dielectric film formed on the interface layer; and
   a gate electrode formed on the high-k gate dielectric film, wherein
   the high-k gate dielectric film contains La,
   the high-k gate dielectric film has a higher La concentration in an interface with the gate electrode than in an interface with the interface layer, and
   the high-k gate dielectric film has the La concentration (atomic %) of 3% or less in the interface with the interface layer.

2. The semiconductor device of claim 1, wherein the high-k gate dielectric film has the La concentration (atomic %) of 2% or less in the interface with the interface layer.

3. The semiconductor device of claim 1, wherein the high-k gate dielectric film has the La concentration (atomic %) of 7% or less in the interface with the gate electrode.

4. The semiconductor device of claim 1, wherein the interface layer has the La concentration (atomic %) of 2% or less in an interface with the semiconductor substrate.

5. The semiconductor device of claim 4, wherein the interface layer has the La concentration (atomic %) of 1% or less in the interface with the semiconductor substrate.

6. The semiconductor device of claim 1, wherein the La concentration distribution in the high-k gate dielectric film is such that the La concentration decreases monotonically from the gate electrode side toward the semiconductor substrate.

7. The semiconductor device of claim 6, wherein the La concentration distribution in the high-k gate dielectric film is such that the La concentration decreases sharply from the gate electrode side toward a central portion in a height direction of the high-k dielectric film, and then decreases gradually toward the interface layer.

8. The semiconductor device of claim 1, wherein the high-k gate dielectric film is made of an oxide film containing hafnium or zirconium.

9. The semiconductor device of claim 1, wherein the gate electrode is made of titanium nitride (TiN), tantalum nitride (TaN), carbon-containing tantalum (TaC), or aluminum-containing titanium nitride (TiAlN).

10. A method for manufacturing a semiconductor device, comprising the steps of:
   (a) forming an interface layer on a semiconductor substrate having a P-type transistor formation region and an N-type transistor formation region;
   (b) forming a high-k gate dielectric film on the interface layer;
   (c) forming on the high-k gate dielectric film a hard mask that covers the P-type transistor formation region;
   (d) after the step (c), forming the La layer over the semiconductor substrate;
   (e) performing an annealing process to diffuse La from the La layer into the high-k gate dielectric film in the N-type transistor formation region;
   (f) removing the La layer remaining after the step (e); and
   (g) after the step (f), forming in the P-type transistor formation region a P-type gate electrode on the high-k gate dielectric film via the hard mask, and forming in the N-type transistor formation region an N-type gate electrode on the high-k gate dielectric film, wherein
   the high-k gate dielectric film has a higher La concentration in an interface with the gate electrode than in an interface with the interface layer.

11. The method of claim 10, wherein
   the formation of the La layer in the step (d) is a step that is performed by using a PVD method, a CVD method, or an atomic layer deposition method by using the La or $La_2O_3$ target, and
   the annealing process in the step (e) is a step that is performed at a temperature between 400° C. and 800° C., both inclusive.

* * * * *